United States Patent
Hoentschel et al.

(10) Patent No.: US 8,748,281 B2
(45) Date of Patent: Jun. 10, 2014

(54) ENHANCED CONFINEMENT OF SENSITIVE MATERIALS OF A HIGH-K METAL GATE ELECTRODE STRUCTURE

(75) Inventors: Jan Hoentschel, Dresden (DE); Sven Beyer, Dresden (DE); Thilo Scheiper, Dresden (DE); Uwe Griebenow, Markkleeberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 439 days.

(21) Appl. No.: 12/907,596

(22) Filed: Oct. 19, 2010

(65) Prior Publication Data

US 2011/0156099 A1    Jun. 30, 2011

(30) Foreign Application Priority Data

Dec. 30, 2009    (DE) .......................... 10 2009 055 393

(51) Int. Cl.
*H01L 21/336*    (2006.01)
(52) U.S. Cl.
USPC ............ 438/303; 257/E21.633; 257/E21.637; 438/592
(58) Field of Classification Search
USPC ......................................................... 438/303
See application file for complete search history.

(56) References Cited

U.S. PATENT DOCUMENTS

| | | | | |
|---|---|---|---|---|
| 6,642,119 | B1 * | 11/2003 | Pelella et al. ................. | 438/303 |
| 6,852,600 | B1 * | 2/2005 | Wang et al. .................. | 438/301 |
| 2002/0025643 | A1 * | 2/2002 | Akram et al. ................. | 438/305 |
| 2005/0118769 | A1 * | 6/2005 | Kammler et al. ............. | 438/303 |
| 2007/0020839 | A1 * | 1/2007 | Sridhar et al. ................ | 438/199 |
| 2008/0153221 | A1 * | 6/2008 | Sridhar et al. ................ | 438/230 |
| 2008/0254579 | A1 | 10/2008 | Chi et al. ...................... | 438/199 |
| 2009/0032841 | A1 * | 2/2009 | Eller et al. .................... | 257/190 |
| 2010/0207214 | A1 * | 8/2010 | Chuang et al. ................ | 257/369 |

OTHER PUBLICATIONS

Translation of Official Communication from German Patent Office for German Patent Application No. 10 2009 055 393.2-33 dated Mar. 21, 2011.

* cited by examiner

*Primary Examiner* — W. Wendy Kuo
*Assistant Examiner* — Shaka White
(74) *Attorney, Agent, or Firm* — Amerson Law Firm, PLLC

(57) ABSTRACT

When forming sophisticated high-k metal gate electrode structures, the removal of a dielectric cap material may be accomplished with superior process uniformity by using a silicon dioxide material. In other illustrative embodiments, an enhanced spacer regime may be applied, thereby also providing superior implantation conditions for forming drain and source extension regions and drain and source regions.

1 Claim, 12 Drawing Sheets

ENHANCED CONFINEMENT OF SENSITIVE MATERIALS OF A HIGH-K METAL GATE ELECTRODE STRUCTURE

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different silicon regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions, to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. That is, conventionally, the thickness of the silicon dioxide layer has been correspondingly reduced to provide the required capacitance between the gate and the channel region. For example, a channel length of approximately 0.08 µm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials in combination with the high-k dielectric material. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided.

The process of fabricating a sophisticated gate electrode structure on the basis of a high-k dielectric material may require a moderately complex process sequence in order to adjust an appropriate work function for the transistors of different conductivity type and due to the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required.

In other very promising approaches, the sophisticated gate electrode structures may be formed in an early manufacturing stage, while the further processing may be based on many well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and in particular the sensitive high-k dielectric materials, in combination with any metal-containing cap layers, have to remain reliably confined by appropriate materials throughout the entire processing of the semiconductor device.

The encapsulation of the sensitive gate material is accomplished on the basis of silicon nitride materials, i.e., a dielectric cap layer in the gate electrode structure and a silicon nitride spacer structure, wherein the removal of the silicon nitride cap material, which is not only required for maintaining integrity of the silicon material during sophisticated epitaxial growth processes for incorporating a strain-inducing silicon/germanium alloy in P-channel transistors, but is also necessary for performing the complex gate patterning process, may result in significant non-uniformities, as will be explained in more detail with reference to FIGS. 1a-1f.

FIG. 1a schematically illustrates a cross-sectional view of a semiconductor device 100 that comprises a substrate 101, such as a silicon substrate, in combination with a semiconductor layer 102, such as a silicon layer or a semiconductor material comprising a significant amount of silicon. As illustrated, the semiconductor device 100 further comprises transistors 150A, 150B in an early manufacturing stage, which may be formed in and above active regions 102A, 102B, respectively. An active region is to be understood as a semiconductor region in the layer 102 in which PN junctions for one or more transistors are to be formed. The active regions 102A, 102B are typically laterally delineated by any appropriate isolation structure, such as a shallow trench isolation (not shown). Furthermore, gate electrode structures 160A, 160B are formed on the active regions 102A, 102B, respectively. As previously discussed, the gate electrode structures 160A, 160B comprise a gate insulation layer 161 formed on the active regions 102A and 102B and comprise a high-k dielectric material, such as hafnium oxide-based materials and the like. The gate insulation layers 161 may additionally comprise a conventional dielectric material, such as a silicon oxide-based material, however, with a significantly reduced thickness of approximately 0.8 nm and less. Consequently, the gate insulation layers 161 may represent any appropriate material composition or a stack of layers to provide the desired thickness, for instance, 1.5 nm and more, while, however, the overall dielectric constant may correspond to that of a silicon oxide-based material having a thickness of 1 nm and significantly less so that any leakage currents may be significantly less compared to conventional extremely thin silicon oxide-based materials.

As discussed above, a metal-containing material is formed on the gate insulation layers 161 and has an appropriate composition for the transistor under consideration. For example, a conductive cap layer 162A is provided in the gate electrode structure 160A and may have incorporated therein an appropriate metal species or may represent an appropriate metal species so as to obtain the desired work function. In other cases, an appropriate work function metal species may also be incorporated in the gate dielectric material 161, depending on the overall process strategy. Similarly, a metal-containing material layer 162B is formed so as to result in a desired work function for the gate electrode structure 160B. In the example shown, the transistor 150A represents a P-channel transistor, while the transistor 150B is an N-channel transistor. In this case, for instance, aluminum may be used as a work function metal species for the gate electrode structure 160A, while lanthanum may be used as a work function metal species for the gate electrode structure 160B. It should be appreciated that, in other approaches, the metal-containing cap layers 162A, 162B may have substantially the same configuration, while the work function adjusting species may be incorporated in the gate dielectric material 161, thereby obtaining the desired work functions for the transistors 150A, 150B, respectively.

The gate electrode structures 160A, 160B further comprise an additional electrode material 163, such as silicon, silicon/germanium and the like, which is formed above the conductive cap layers 162A, 162B, which represent a part of the electrode material of the gate electrode structures. Furthermore, a silicon nitride cap layer 164 is formed above the additional electrode material 163. As indicated above, the silicon nitride cap material 164 is used for patterning the gate electrode structures 160A, 160B and may also act as a mask material in sophisticated applications, in which a strain-inducing semiconductor alloy 151, such as a silicon/germanium, is to be formed in the active region of one or both of the transistors 150A, 150B. In the example shown, the strain-inducing semiconductor material 151 is selectively provided in the active region 102A in the form of a compressive strain-inducing material in order to enhance performance of the P-channel transistor 150A. It is well known that, for a standard crystallographic configuration of the active region 102A, a compressive strain component along the current flow direction, i.e., in FIG. 1a, the horizontal direction within a channel region 152 of a P-channel transistor, may result in superior charge carrier mobility and, thus, current drive capability.

Moreover, as discussed above, a silicon nitride-based sidewall spacer structure 155, which may comprise a liner material 155A in combination with a spacer element 155B, is provided to protect the sidewalls of the electrode material 163 and, in particular, of the sensitive materials 162A, 162B and 161. The liner 155A and the spacer element 155B may typically be comprised of a dense silicon nitride material so as to provide a desired high chemical resistivity. On the other hand, the materials of the spacer structure 155 may be provided in the form of non-patterned layers for the transistor 150B in order to provide a growth mask for forming the strain-inducing semiconductor material 151 in the active region 102A substantially without affecting the transistor 150B.

The semiconductor device 100 as illustrated in FIG. 1a is typically formed on the basis of the following process strategies. After forming any isolation structures and, thus, laterally delineating the active regions 102A, 102B, appropriate materials for the gate insulation layers 161 and one of the layers 162A and 162B are formed by any appropriate deposition technique. Thereafter, the conductive cap material is appropriately patterned and the other one of the layers 162A, 162B is deposited, possibly followed by any heat treatments in order to appropriately diffuse a work function adjusting species towards the gate insulation layers 161. Depending on the process strategy, corresponding work function metal species, such as aluminum, lanthanum and the like, may be provided as individual material layers, followed or sandwiched by any other appropriate material, such as titanium nitride, wherein some or all of these material layers may be removed after having diffused the work function metal species into the gate dielectric materials 161. Thereafter, a further conductive cap material, such as titanium nitride, may commonly be formed in the gate electrode structures 160A, 160B. In other strategies, an appropriate stack of conductive materials may be individually provided in the gate electrode structures 160A, 160B so as to achieve the required electronic characteristics.

It should be appreciated that adaptation of the threshold voltage may require a corresponding adjustment or shift of the band gap of the semiconductor material in the channel region 152, which may, for instance, be accomplished by incorporating an appropriate material, such as a silicon/germanium material, in the channel region 152 of P-channel transistors, which has a reduced band gap compared to a pure silicon material. To this end, a silicon/germanium material (not shown) may be formed in the active region 102A prior to forming the gate electrode structures 160A, 160B. Consequently, the corresponding silicon/germanium material is then to be considered as a portion of the channel region 152. After providing the appropriate work function metal species or after performing corresponding diffusion processes, the electrode material 163, for instance in the form of amorphous silicon, is deposited, followed by the deposition of the silicon nitride cap layer 164, wherein additional materials, such as hard mask materials in the form of amorphous carbon and the like, may also be provided as required. Thereafter, a sophisticated lithography process and an anisotropic etch sequence are performed, in which the silicon nitride cap layer 164 is used for achieving the critical dimensions of 50 nm and significantly less in accordance with the overall design rules. Next, the materials 155A, 155B are formed, for instance by thermally activated chemical vapor deposition (CVD) techniques, such as multilayer deposition techniques and the like, possibly in combination with plasma enhanced CVD techniques, low pressure CVD and the like, in order to form, in particular, the liner material 155A as a very dense silicon nitride material that reliably confines the sidewalls of the gate electrode structures. Thereafter, an etch mask is provided to cover the transistor 150B in order to form the spacer element 155B and possibly etch into the active region 102A in order to form cavities therein. Next, a selective epitaxial growth process is performed in which the strain-inducing semiconductor material 151 is grown in the previously formed cavities, while the silicon nitride cap layer 164, the spacer structure 155 and the non-patterned material 155 above the transistor 150B may act as a growth mask so as to avoid undue material deposition thereon.

FIG. 1b schematically illustrates the semiconductor device 100 in a manufacturing stage in which an etch mask 103 covers the active region 102A and exposes the gate electrode structure 160B and the active region 102B. An etch process 104 is applied in order to form the spacer structure 155 on sidewalls of the gate electrode structure 160B, which is accomplished by well-established plasma assisted etch recipes. It should be appreciated that, during the etch process 104, a certain amount of material erosion in the active region 102B, or at least a material modification, may occur. For example, plasma assisted etch recipes for removing silicon nitride material may exhibit a self limiting behavior when interacting with the underlying silicon material, wherein silicon dioxide is generated, which may then act as an efficient etch stop material, since the corresponding etch chemistry is highly selective to silicon dioxide material. After the etch process 104, the etch mask 103 is removed and consequently the gate electrode structures 160A, 160B have the sidewall spacer structures 155 provided on both gate electrode structures. During the further processing, the dielectric cap layers 164 have to be removed, which, however, may have a significant influence on the resulting surface topography and, thus, on the resulting transistor characteristics. For instance, upon removing the dielectric cap material 164, wet chemical etch recipes on the basis of phosphoric acid are typically applied, which, thus, could cause a significant degree of material erosion in the spacer structure 155. For this reason, the spacer structure 155 is typically protected by providing a sacrificial spacer element having an increased etch resistivity with respect to the silicon nitride etch chemistry, which may be accomplished on the basis of an oxide spacer.

FIG. 1c schematically illustrates the semiconductor device 100 with an oxide spacer layer 166, which is etched during an etch process 105 in order to form sacrificial oxide spacers 166S on the sidewall spacer structure 155. Consequently, during the etch process 105, a certain degree of recessing may occur, in particular in the active region 102B, due to any previously performed etch processes and oxide materials created, for instance, during the silicon nitride etch process, as discussed above.

FIG. 1d schematically illustrates the device 100 when exposed to a further etch process 106 for removing the dielectric cap material 164 on the basis of, for instance, phosphoric acid, thereby also causing a certain degree of recessing in the active regions 102A, 102B, as indicated by 102R.

FIG. 1e schematically illustrates the semiconductor device 100 in a manufacturing stage in which the sacrificial spacer elements 166S (FIG. 1d) are removed, which may be accomplished on the basis of diluted hydrofluoric acid (HF). It should be appreciated that this etch process and also the preceding etch process for forming the sacrificial spacer elements 166S (FIG. 1d) may also result in a significant material erosion in any isolation structures (not shown), thereby contributing to a pronounced surface topography during the further processing, which may also negatively affect overall device characteristics.

FIG. 1f schematically illustrates the device 100 during an implantation sequence 107 in order to form drain and source extension regions 153E in the active region 102A. To this end, an implantation mask 108 is provided that covers the active region 102B. In the example shown, drain extension regions 153E have already been formed in the active region 102B, possibly in combination with counter-doped regions or halo regions 153H, which are typically required in sophisticated transistors in order to appropriately adjust the transistor off-current or the like. During the implantation sequence 107, the recesses 102R may affect the resulting configuration of the extension regions 153E and of the halo regions, which are to be formed on the basis of a tilted implantation process. Generally, the implantation of the halo regions 153H may require a lower implantation energy as would be desirable due to the presence of the recess 102R and due to the reduced ion blocking effect of the gate electrode structures 160A, 160B in order to avoid undue deposition of dopant species in the channel regions 152, which may otherwise occur when a desired higher implantation energy would be selected for obtaining an increased penetration depth of the halo regions 153H. On the other hand, forming the extension regions 153E and the halo regions 153H prior to removing the dielectric cap material 164 (FIG. 1d) may be a less attractive approach, since, in this case, a significant amount of the dopants in the extension regions 153E would be removed in the subsequent process sequence for removing the dielectric cap layer 164 due to the material erosion in close proximity to the channel region 152. In this case, additional implantation processes would be required so as to appropriately connect deep drain and source regions still to be formed with the drain and source extension regions. Consequently, it is very difficult to provide appropriate dopant profiles in the active regions 102A, 102B without introducing significant additional process complexity, for instance by performing additional implantation processes and associated lithography steps. Consequently, although the approach of providing sophisticated high-k metal gate electrode structures with appropriately set work function values at an early manufacturing stage is basically a promising approach, the inferior dopant profiles or the significantly increased complexity of the overall process flow may make this concept less attractive.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the confinement of sensitive gate materials may be accomplished on the basis of appropriate cap layer systems and/or spacer structures, while the removal of the dielectric cap material may be performed with significantly less impact on device characteristics compared to conventional strategies. To this end, in some illustrative aspects disclosed herein, an appropriate dielectric material for the cap layer in the gate electrode structures may be used in order to avoid any application of silicon nitride chemistries, which may conventionally result in pronounced non-uniformities. In one illustrative embodiment, a silicon dioxide-based material may be used as a dielectric cap material in sophisticated gate electrode structures, which may be removed on the basis of highly selective etch chemistries without unduly affecting at least active regions of the transistor devices. In other illustrative aspects disclosed herein, a spacer structure may be provided to protect a sidewall spacer structure during the removal of the dielectric cap layer, while at the same time the spacer structure may also be used as an implantation mask for forming the deep drain and source regions in the presence of the dielectric cap layer, thereby providing superior process conditions for forming extension regions, halo regions and the drain and source regions due to the superior ion blocking capability of the gate electrode structure.

One illustrative method disclosed herein comprises forming a gate electrode structure of a transistor above a semiconductor region of a semiconductor device. The gate electrode structure comprises a gate insulation layer comprising a high-k gate dielectric material, a metal-containing cap material formed on the gate insulation layer, an electrode material formed above the cap material and a dielectric cap layer formed above the electrode material. The method further comprises forming a first spacer structure on sidewalls of the gate electrode structure and performing a first implantation process to form drain and source extension regions by using at least a portion of the gate electrode structure and the first spacer structure as a first implantation mask. The method further comprises removing the dielectric cap layer by using the first spacer structure as an etch stop material. Moreover, a second spacer structure is formed on the first spacer structure and a second implantation process is performed to form drain and source regions by using the second spacer structure as a second implantation mask.

A further illustrative method disclosed herein relates to forming a transistor for a semiconductor device. The method comprises forming drain and source extension regions in an active region of the transistor by using a gate electrode structure and a first sidewall spacer structure formed on sidewalls of the gate electrode structure as a first implantation mask. The gate electrode structure comprises a high-k dielectric material, an electrode material and a dielectric cap layer. The method further comprises forming a second sidewall spacer structure adjacent to the first sidewall spacer structure and forming drain and source regions by using the first and second sidewall spacer structures and the gate electrode structure including the dielectric cap layer as an implantation mask. Additionally, the method comprises removing the dielectric cap layer by using the second sidewall spacer structure as an etch stop material and forming a metal silicide in the drain and source regions and in the gate electrode structure.

One illustrative semiconductor device disclosed herein comprises a gate electrode structure formed on a semiconductor region, wherein the gate electrode structure comprises a gate insulation layer including a high-k dielectric material, an electrode material and a metal silicide material. The semiconductor device further comprises a first sidewall spacer structure formed on sidewalls of at least a portion of the gate electrode structure. Additionally, the semiconductor device comprises a second sidewall spacer structure formed on the first sidewall spacer structure and comprising a silicon dioxide spacer element.

BRIEF DESCRIPTION OF THE DRAWINGS

The disclosure may be understood by reference to the following description taken in conjunction with the accompanying drawings, in which like reference numerals identify like elements, and in which.

Figure 1A:
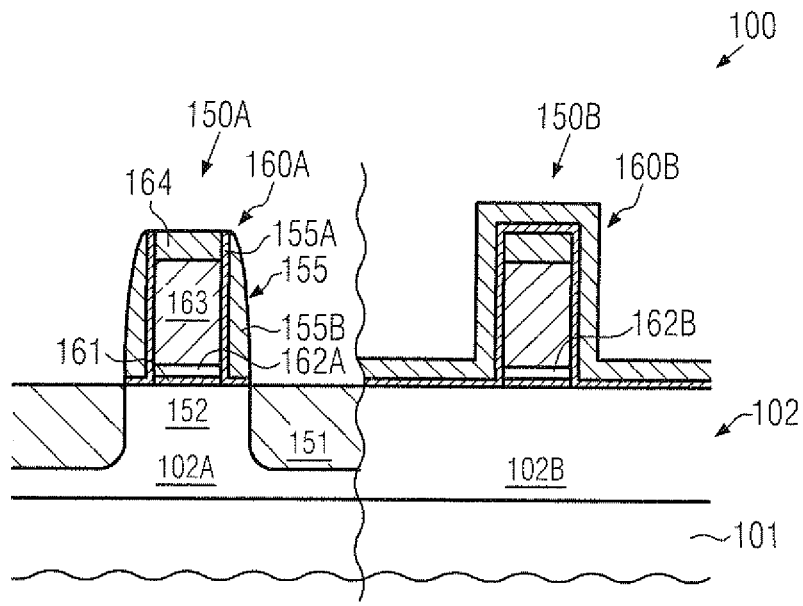
FIGS. 1a-1f schematically illustrate cross-sectional views of a semiconductor device during various manufacturing stages in forming transistors including a high-k metal gate electrode structure, wherein the silicon nitride cap material is removed on the basis of hot phosphoric acid in combination with a sacrificial oxide spacer, according to conventional strategies.
Figure 1B:
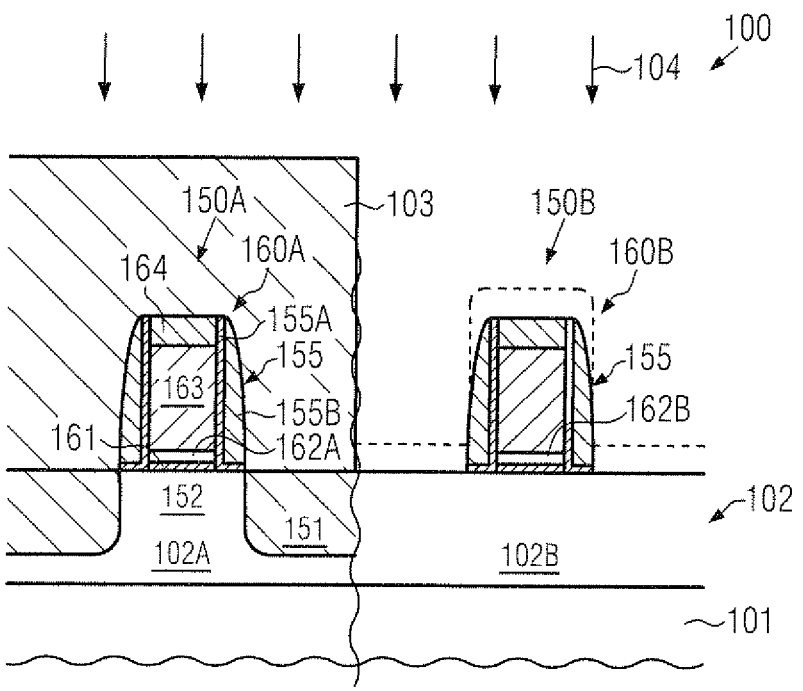
Figure 1C:
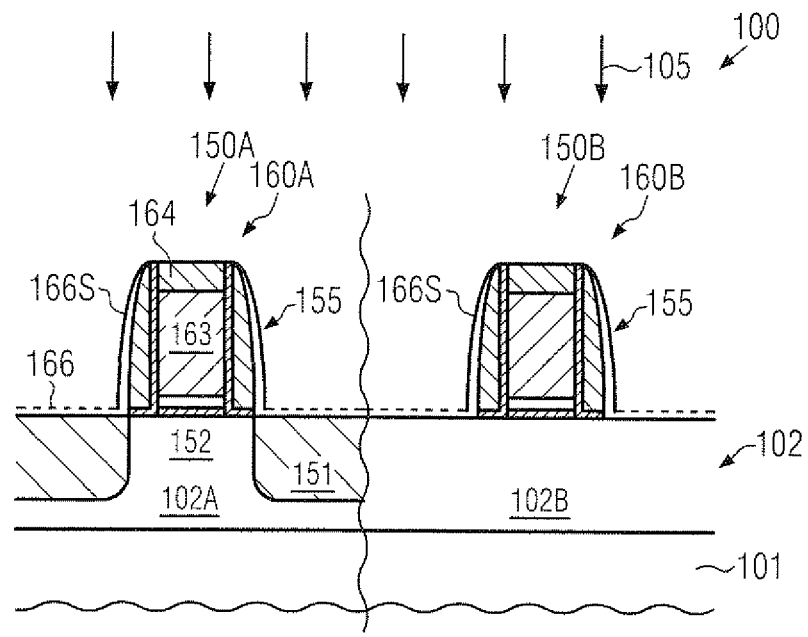
Figure 1D:
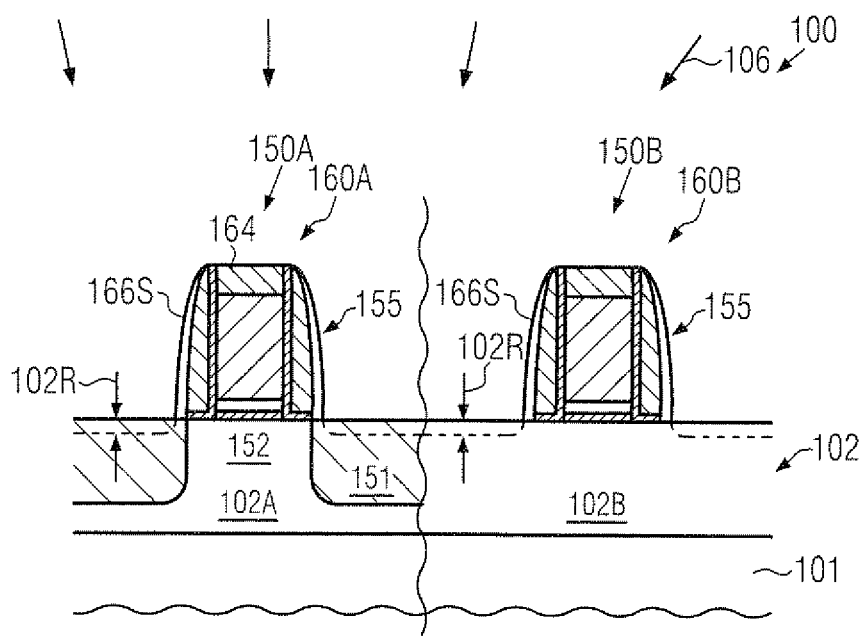
Figure 1E:
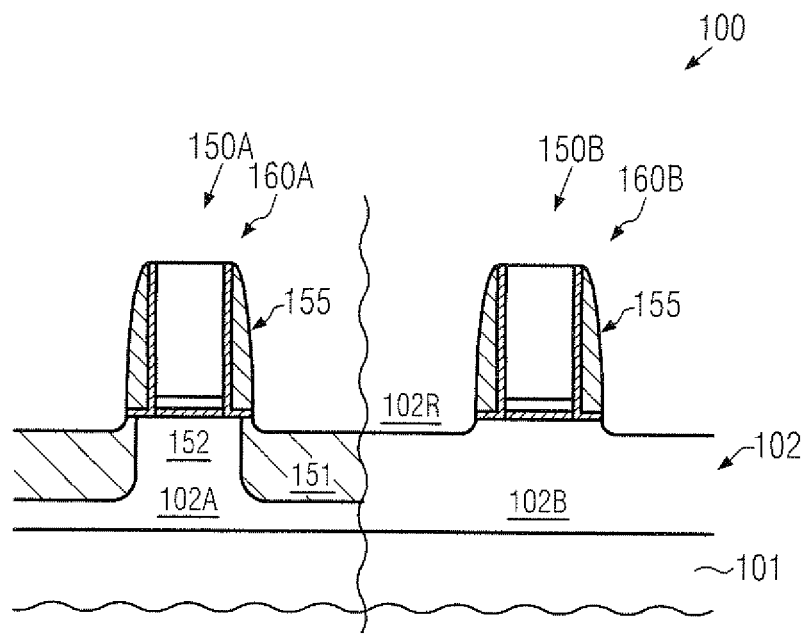
Figure 1F:
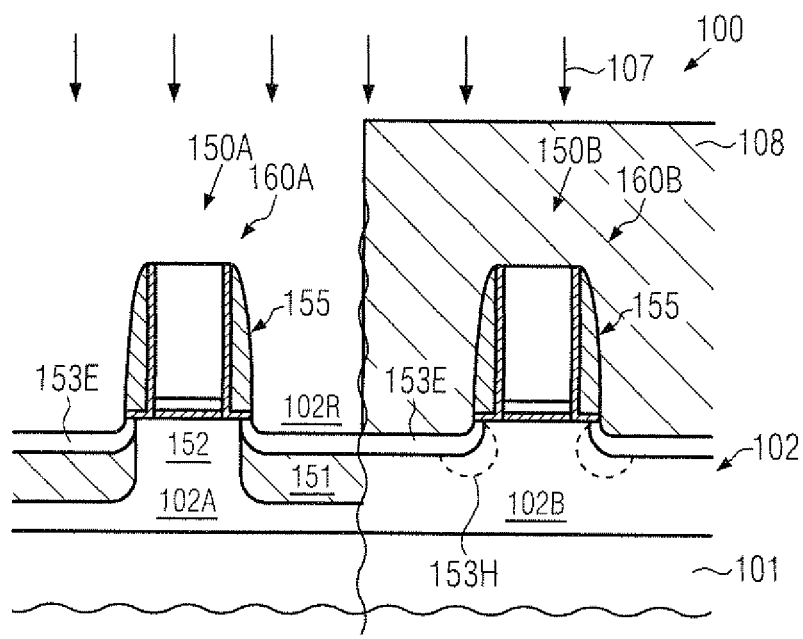

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which superior transistor characteristics may be obtained in a process flow in which the work function and, thus, threshold voltage of the transistors may be adjusted in an early manufacturing stage. To this end, the dielectric cap material of the gate electrode structures may be removed such that any negative influences may be significantly reduced, for instance, by avoiding the application of a silicon nitride etch chemistry and/or by simplifying the spacer structure used for preserving integrity of the sidewall encapsulation of the gate electrode structure upon removing the dielectric cap material. Furthermore, in some illustrative embodiments disclosed herein, in addition to the reduced negative effects of the removal of the dielectric cap material, superior implantation profiles may be obtained by enabling applying increased implantation energies, for instance for the halo regions, since the ion blocking effect of the gate electrode structures may be increased by removing the dielectric cap layer after implanting at least the drain and source extension regions and the halo regions.

With reference to FIGS. 2a-2j and 3a-3h, further illustrative embodiments will now be described in more detail, wherein reference is also made to FIGS. 1a-1f, if required.

Figure 2A:
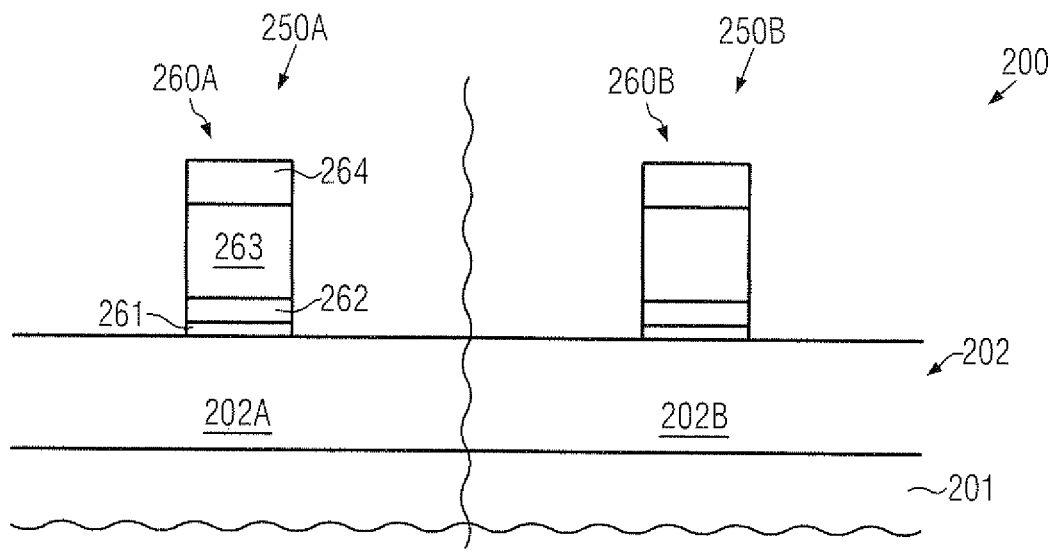
FIGS. 2a-2f schematically illustrate cross-sectional views of a semiconductor device during various manufacturing stages, in which a silicon dioxide-based dielectric cap material may be used in a sophisticated gate electrode structure, which may be removed without affecting a silicon nitride sidewall spacer structure, according to illustrative embodiments.

FIG. 2a schematically illustrates a cross-sectional view of a semiconductor device 200 comprising a substrate 201 and a semiconductor layer 202. Moreover, semiconductor regions or active regions 202A, 202B are formed in the semiconductor layer 202, for instance on the basis of isolation structures (not shown). The active regions 202A, 202B may represent the active regions of transistors 250A, 250B, which may represent complementary transistors or transistors of the same conductivity type and the like. In the manufacturing stage shown, the transistors 250A, 250B may comprise gate electrode structures 260A, 260B, respectively, including a gate insulation layer 261, a conductive cap material 262 and an additional semiconductor-based electrode material 263, such as silicon, silicon/germanium and the like. It should be appreciated that, with respect to the components of the device 200 as described so far, the same criteria may apply as previously discussed with reference to the semiconductor device 100. For example, the gate dielectric material 261 may be considered as a high-k dielectric material, since the dielectric constant may be 10.0 or higher, at least partially within the material 261, which may be accomplished by providing a combination of conventional dielectrics in combination with high-k dielectric materials, such as hafnium oxide, hafnium silicon oxide and the like. Moreover, as previously discussed, the gate dielectric layers 261 may comprise appropriate species in order to obtain specific dipole charges, which, in combination with the conductive material 262, may result in a desired work function of the gate electrode structures 260A, 260B. Moreover, appropriate work function adjusting metal species may be incorporated in the layers 262, if required, so as to comply with the transistor characteristics of the devices 250A, 250B, as is also previously explained with reference to the semiconductor device 100 when referring to conductive cap layers 162A, 162B (FIG. 1a). It should be appreciated, therefore, that the layers 261 and 262 in the gate electrode structure 260A may be appropriately configured to provide the required threshold voltage of the transistor 250A, which may, for instance, represent a P-channel transistor or an N-channel transistor. Similarly, the gate dielectric material 261 and the conductive cap layer 262 of the gate electrode structure 260B may be appropriately configured to obtain the desired work function and, thus, threshold voltage of the transistor 250B, which may represent an N-channel transistor or a P-channel transistor, if complementary transistors are considered. Moreover, the gate electrode structures 260A, 260B may comprise a dielectric cap material 264, which may have any appropriate material composition so as to be removed on the basis of an etch chemistry, which may substantially not attack an encapsulating material that has to be formed on sidewalls of the gate electrode structures 260A, 260B in subsequent process steps. In one illustrative embodiment, the dielectric cap material 264 may be comprised of silicon dioxide, which may typically be removed on the basis of a plurality of etch chemistries, which in turn are also highly selective with respect to silicon nitride material.

The semiconductor device 200 as illustrated in FIG. 2a may be formed on the basis of similar process techniques as are also described with reference to the device 100 for providing the active regions 202A, 202B and the components 261, 262 and 263 of the gate electrode structures 260A, 260B. The dielectric cap material 264 having the desired etch behavior may be formed on the basis of any appropriate deposition technique, such as low pressure CVD, plasma assisted CVD and the like. For example, deposition recipes for forming a silicon dioxide material are well established and may be used to form a gate layer stack including the cap material 264, which may then be patterned by sophisticated lithography and etch techniques, as is also previously described. It should be appreciated that the material 264 may also be used during the patterning sequence as a hard mask in order to obtain the desired critical dimension of the gate electrode structures 260A, 260B.

Figure 2B:
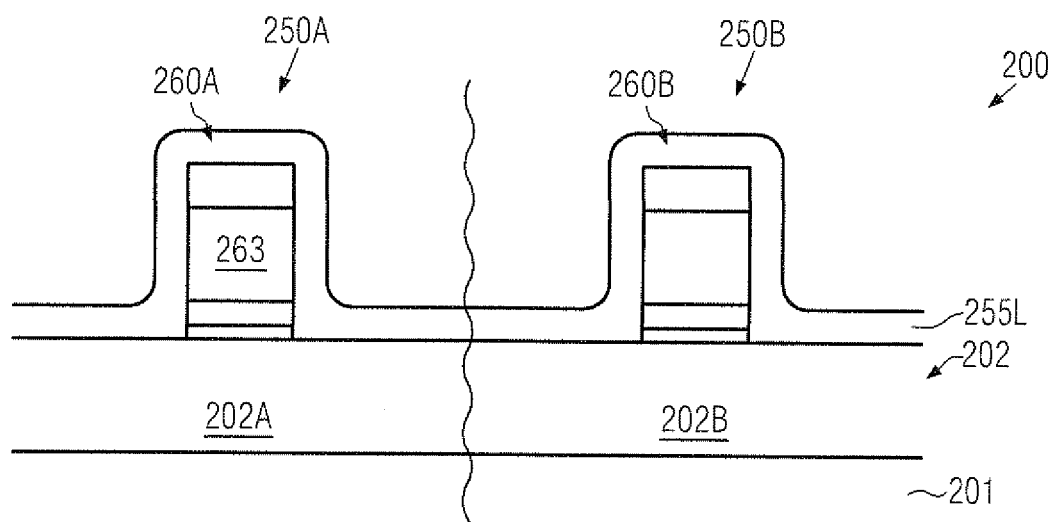

FIG. 2b schematically illustrates the semiconductor device 200 with a liner material 255L formed above the active regions 202A, 202B and on the gate electrode structures 260A, 260B. As previously explained, the liner material 255L, for example comprised of silicon nitride, may be formed with the desired material characteristics to provide integrity of the sensitive materials 261 and 262 in order to avoid any modification of the previously adjusted work function and, thus, threshold voltage. The liner material 255L may be formed on the basis of any appropriate deposition technique, such as multilayer deposition, low pressure CVD, or any combination thereof, and the like. Thereafter, the liner material 255L may be etched on the basis of anisotropic etch techniques in order to form a sidewall spacer structure on the gate electrode structures 260A, 260B.

Figure 2C:
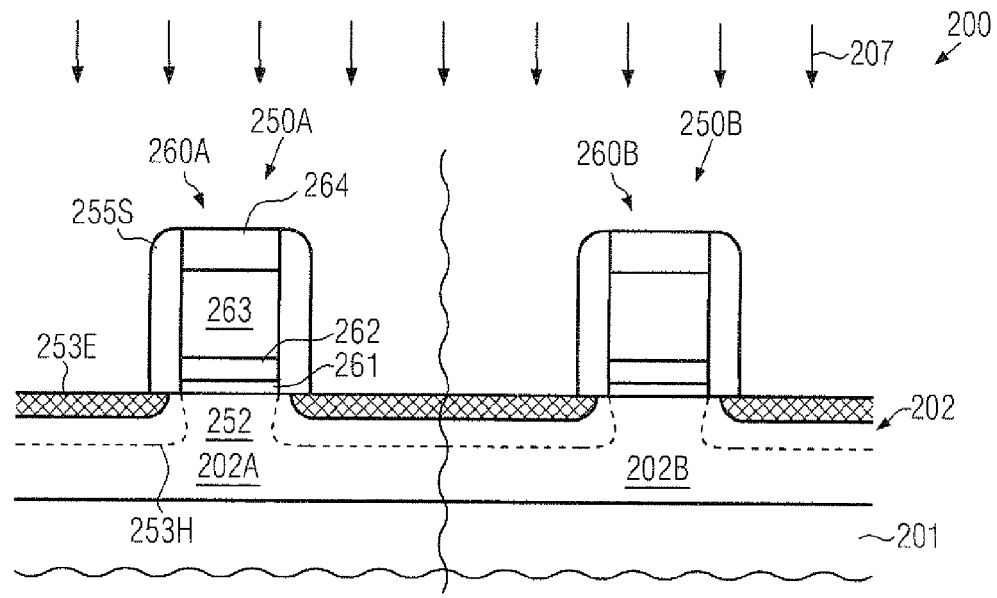

FIG. 2c schematically illustrates the semiconductor device 200 in a further advanced manufacturing stage. As illustrated, a sidewall spacer structure 255S may be formed on sidewalls of the gate electrode structures 260A, 260B, and may, thus, provide, in combination with the dielectric cap layer 264, the encapsulation of the materials 263, 262 and 261. Moreover, in the embodiment shown, the device 200 may be subjected to an implantation sequence 207 for forming drain and source extension regions 253E and halo regions 253H in the active regions 202A, 202B. In the embodiment shown in FIG. 2c, it is assumed that a strain-inducing mechanism on the basis of a strain-inducing semiconductor material may not be required. For example, the semiconductor device 200 may represent a device designed for reduced power consumption, wherein a certain reduced performance may be acceptable. During the implantation sequence 207, appropriate dopant species may be incorporated on the basis of an appropriate masking regime, when the transistors 250A, 250B represent transistors of different conductivity type or transistors of different threshold voltages, which may, thus, require different dopant concentrations. For example, the transistor 250B may be masked, while appropriate implantation processes may be performed so as to incorporate the dopants for the extension regions 253E and the halo regions 253H for the transistor 250A. Thereafter, the transistor 250A may be masked and appropriate dopants may be incorporated into the active region 202B. During the implantation process 207, generally, superior process conditions may be established, for instance in terms of an increased implantation energy, in particular for incorporating the dopants for the halo regions 253H, since the dielectric cap layer 264 may result in a superior ion blocking effect, thereby avoiding penetration of the channel region 252 even for an increased implantation energy. Furthermore, a reduced degree of recessing in the active regions 202A, 202B may be achieved compared to the conventional strategy, as previously described, since any interaction of a silicon nitride etch chemistry, typically used for removing the conventional silicon nitride cap material, may be avoided. On the other hand, the cap material 264, for instance in the form of a silicon dioxide material, may be efficiently removed in a later manufacturing stage, without unduly consuming materials, and thus dopants, in the active regions 202A, 202B due to the superior etch selectivity with respect to the silicon material in the active regions 202A, 202B.

Figure 2D:
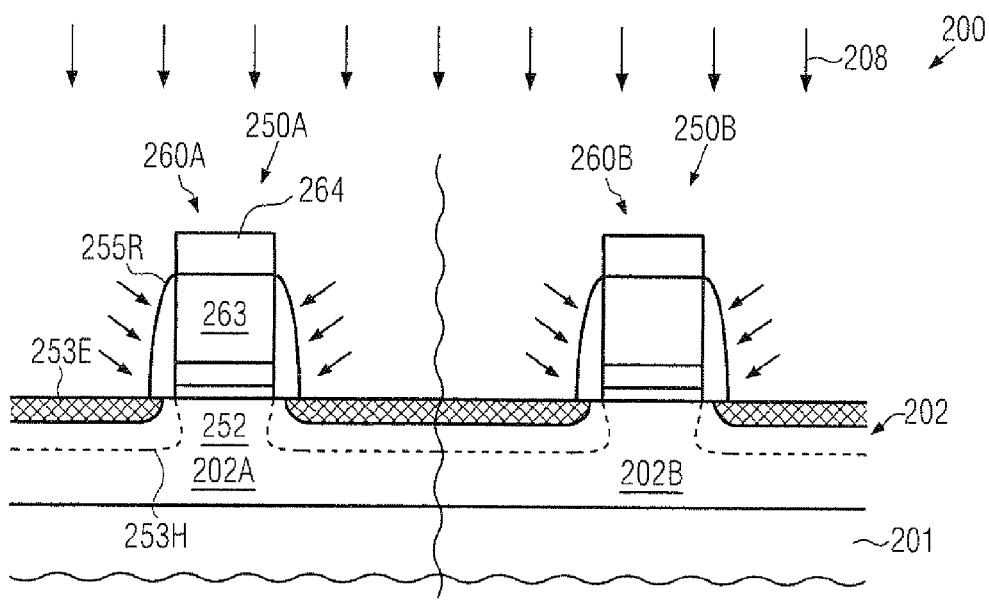

FIG. 2d schematically illustrates the semiconductor device 200 according to illustrative embodiments in which the size of the spacer structure 255S (FIG. 2c) may be reduced, if considered appropriate for the further processing. In this case, a reactive process 208, for instance a cleaning process on the basis of well-established cleaning chemicals, such as ammonium, hydrogen peroxide, sulfuric acid and the like, may be performed, thereby obtaining spacers of reduced size, as indicated by 255R, substantially without affecting the exposed areas of the active regions 202A, 202B. In other cases, plasma assisted etch processes may be applied, which, however, may affect other exposed device areas less significantly, since only a moderately short process time may be required to obtain the reduced spacers 255R, if required. In other illustrative embodiments, the process 208 may not be performed, when the removal of the cap layer 264 during the further processing may not be unduly influenced by the non-reduced spacer structure 255S as shown in FIG. 2c.

Figure 2E:
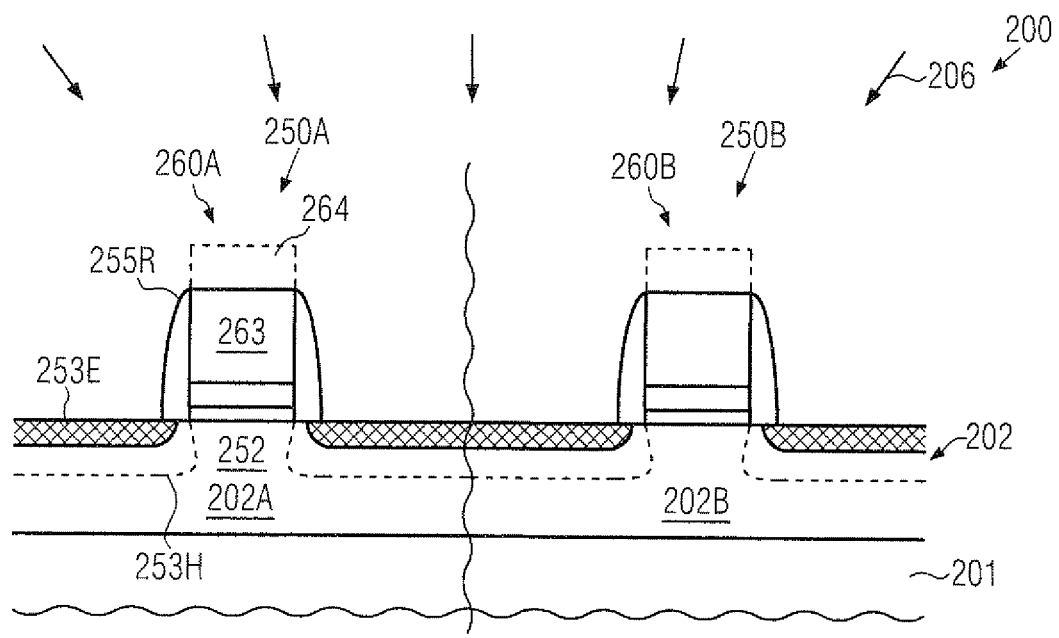

FIG. 2e schematically illustrates the semiconductor device 200 during an etch process 206, which may be performed on the basis of an etch chemistry for removing the cap layer 264 selectively with respect to the spacer structure 255R. In one illustrative embodiment, the etch process 206 may be performed on the basis of hydrofluoric acid in order to remove silicon oxide material highly selectively with respect to silicon material and silicon nitride material, thereby substantially not affecting the electrode material 263, while also not causing an undue material removal in the active regions 202A, 202B. Consequently, undue dopant loss of the drain and source extension regions 253E in close proximity to the channel regions 252 may be avoided. Thereafter, the processing may be continued on the basis of any appropriate process strategy for forming drain and source regions so as to connect to the extension regions 253E with a desired profile, wherein, in particular, the halo regions 253H having the superior configuration may result in an overall superior dopant profile.

Figure 2F:
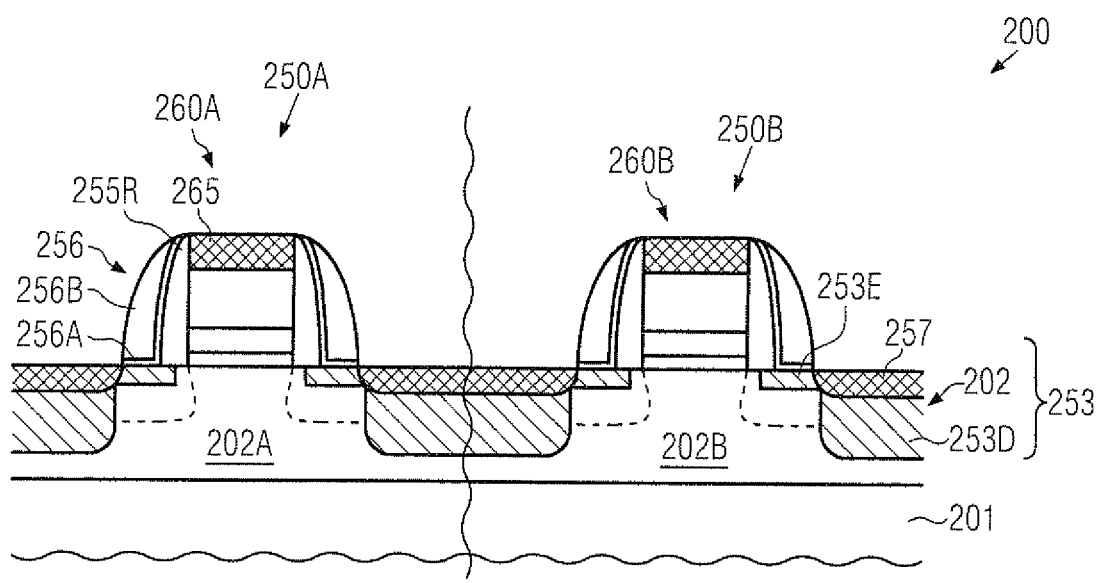

FIG. 2f schematically illustrates the semiconductor device 200 in a further advanced manufacturing stage. As illustrated, a sidewall spacer structure 256 may be formed on the spacer structure 255R and may comprise an etch stop liner 256A in combination with a spacer element 256B. For example, silicon dioxide and silicon nitride may be used for the components 256A, 256B. In other illustrative embodiments, as will be described later on in more detail, other material compositions may be applied. Moreover, deep drain and source regions 253D, which may have been formed on the basis of the spacer structure 256, are positioned in the active regions 202A, 202B, thereby forming, in combination with the extension regions 253E, the drain and source regions 253 of the transistors 250A, 250B, respectively. Furthermore, in the manufacturing stage shown, a metal silicide 257 may be formed in the drain and source regions 253 in order to reduce the overall series resistance and the contact resistivity of the transistors 250A, 250B. Furthermore, a metal silicide material 265 may be formed in the gate electrode structures 260A, 260B, thereby also contributing to superior conductivity of the gate electrodes.

The semiconductor device 200 as illustrated in FIG. 2f may be formed on the basis of any appropriate process strategy for forming the spacer structure 256 and incorporating the dopant species for the deep drain and source regions 253D using any appropriate masking regime. After any anneal processes for activating the dopants and re-crystallizing implantation-induced damage, the metal silicide regions 265 and 257 may be formed in a common process sequence. Thereafter, an interlayer dielectric material, such as silicon nitride, silicon dioxide and the like, may be formed above and laterally adjacent to the gate electrode structures 260A, 260B, wherein, if required, a highly stressed dielectric material may be used in order to enhance performance of the transistor 250A and/or 250B.

As a consequence, the transistors 250A, 250B may be provided with the sophisticated high-k metal gate electrode structures 260A, 260B with appropriate work functions adjusted in an early manufacturing stage, wherein, in particular, the provision of the dielectric cap material 264 (FIG. 2a) may result in a very efficient overall process flow and superior transistor characteristics, since the application of a silicon nitride etch chemistry may be avoided during the removal of the dielectric cap material 264.

With reference to FIGS. 2g-2j, further illustrative embodiments will now be described in which a strain-inducing mechanism on the basis of a semiconductor material to be incorporated into the active region of at least one transistor type is to be implemented.

Figure 2G:
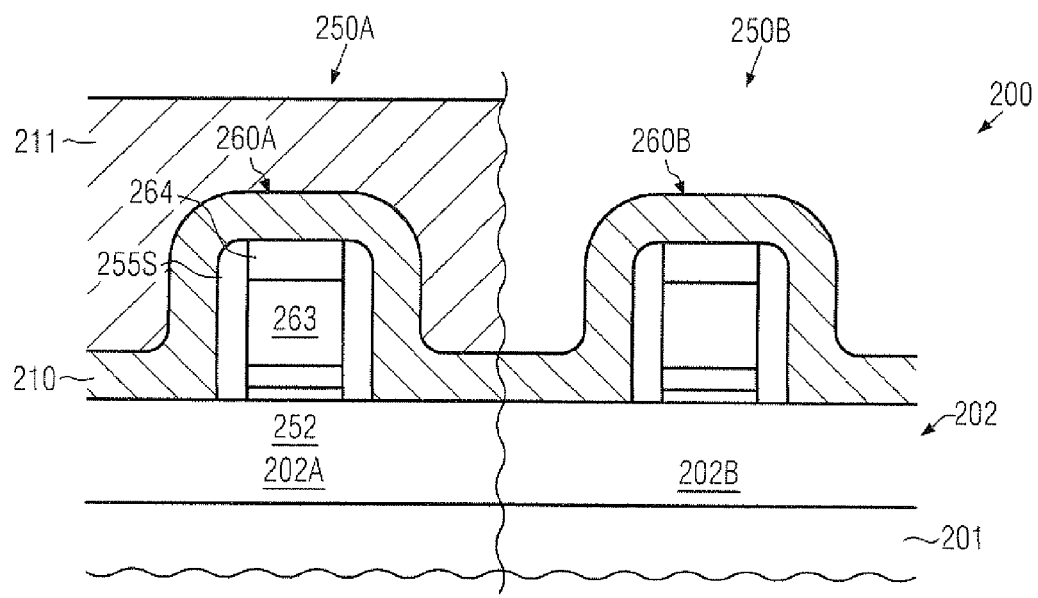
FIGS. 2g-2j schematically illustrate cross-sectional views of the semiconductor device according to illustrative embodiments in which a silicon dioxide-based dielectric cap material may be used in a process flow in which a strain-inducing semiconductor material may be formed on the basis of a high-k metal gate electrode structure.

FIG. 2g schematically illustrates the semiconductor device 200 in a manufacturing stage after the patterning of the gate electrode structures 260A, 260B, which may comprise the dielectric cap material 264 having a material composition that may be etched without applying a silicon nitride etch chemistry. Furthermore, the spacer structure 255S is formed on sidewalls of the gate electrode structures 260A, 260B, as also previously discussed. In the embodiment shown, the transistor 250B may represent a P-channel transistor, which may receive a strain-inducing semiconductor material, such as a silicon/germanium alloy, in the active region 202B laterally adjacent to the gate electrode structure 260B. To this end, a spacer layer 210, such as a silicon dioxide layer, may be formed above the gate electrode structures 260A, 260B and the portion of the spacer layer 210 formed above the transistor 250A may be covered by an etch mask 211, such as a resist mask, a hard mask material, for instance in the form of amorphous carbon, and the like. The layer 210 may be formed in accordance with any appropriate deposition technique, such as plasma enhanced CVD, thermally activated CVD and the like. Furthermore, in some illustrative embodiments, the device 200 may be exposed to elevated temperatures in order to increase the density of the layer 210, which may be accomplished on the basis of temperatures of approximately 800-1100° C. and using any appropriate process atmosphere. Thereafter, the mask 211 may be formed on the basis of well-established lithography techniques.

Figure 2H:
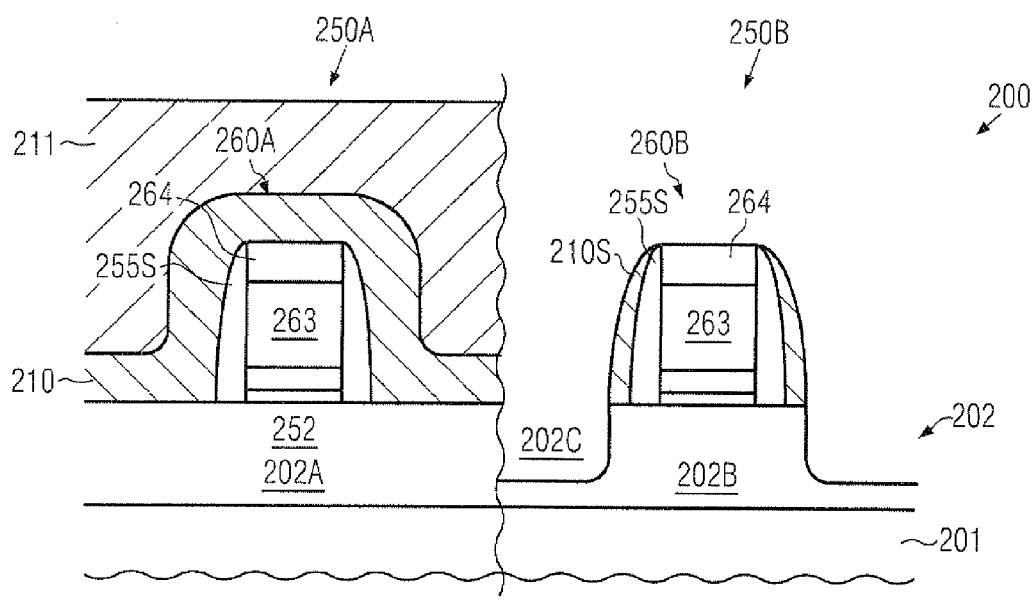

FIG. 2h schematically illustrates the semiconductor device 200 in a further advanced manufacturing stage in which sacrificial spacer elements 210S may be formed from the spacer layer 210 positioned above the transistor 250B by using the mask 211 as an etch mask. For this purpose, well established anisotropic etch techniques may be applied, wherein, in some illustrative embodiments, the etch process may also include an etch step for etching into the material of the active region 202B, thereby forming cavities 202C therein. Thereafter, the mask 211 may be removed, if this mask has been preserved during the etch step for forming the cavities 202C and the further processing may be continued by performing cleaning processes in order to prepare the exposed surface areas of the active region 202B for the deposition of a strain-inducing semiconductor alloy, such as a silicon/germanium material. Next, selective epitaxial growth techniques may be applied in order to refill the cavities 202C with the strain-inducing semiconductor material, while the spacer layer 210 may act as a deposition mask for the transistor 250A. In this case, the dielectric cap layer 264, in combination with the sacrificial spacer 210S, may preserve integrity of the gate electrode material 263. After the selective epitaxial growth process, the mask materials, i.e., the spacer layer 210, the dielectric cap layers 264 and the sacrificial spacer elements 210S may be removed, for instance, in a common etch process by using, for instance, hydrofluoric acid, thereby suppressing any undue material erosion in the active regions 202A, 202B. Consequently, the electrode materials 263 may be efficiently exposed, while the corresponding etch chemistry may not substantially attack the spacer structure 255S, which may, thus, efficiently preserve integrity of the sensitive gate materials. It should be appreciated that, if desired, the spacer structure 255S may be reduced in size prior to depositing the spacer layer 210 in FIG. 2g in order to enhance the etch efficiency upon removing the dielectric cap material 264, similarly as is previously described with reference to FIG. 2d.

Figure 2I:
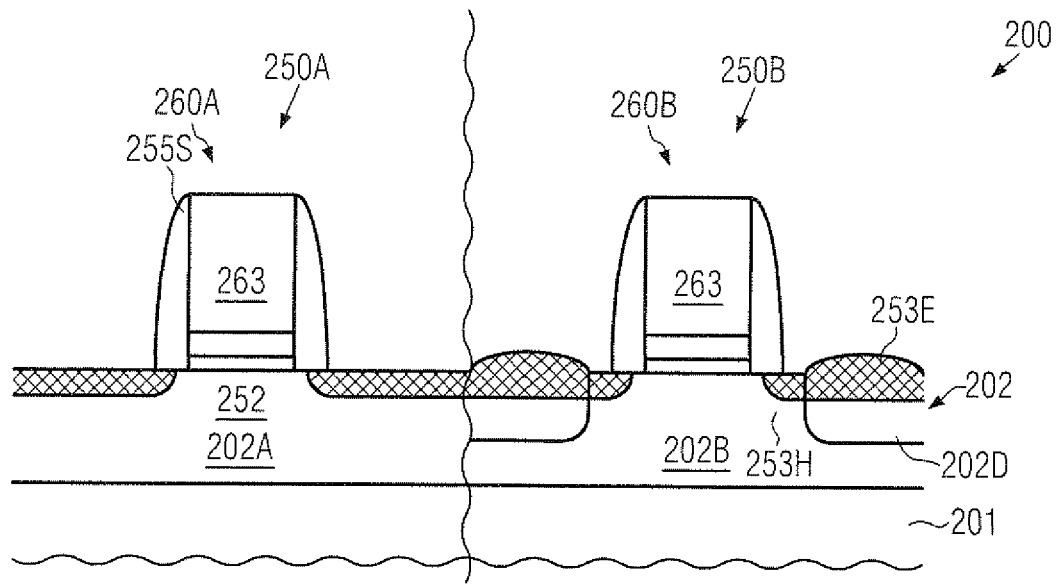

FIG. 2i schematically illustrates the semiconductor device 200 in a further advanced manufacturing stage. As illustrated, a strain-inducing semiconductor alloy 202D, such as a silicon/germanium material, may be formed in the active region 202B. Furthermore, the top surface of the electrode material 263 of the gate electrode structures 260A, 260B may be exposed, while sidewalls may still be reliably covered by the spacer structure 255S. Moreover, drain and source extension regions 253E in combination with halo regions 253H may be formed in the active regions 202A, 202B. To this end, any appropriate implantation sequence and associated masking regimes may be applied in order to incorporate the dopant species for the transistors 250A, 250B corresponding to their conductivity type.

Figure 2J:
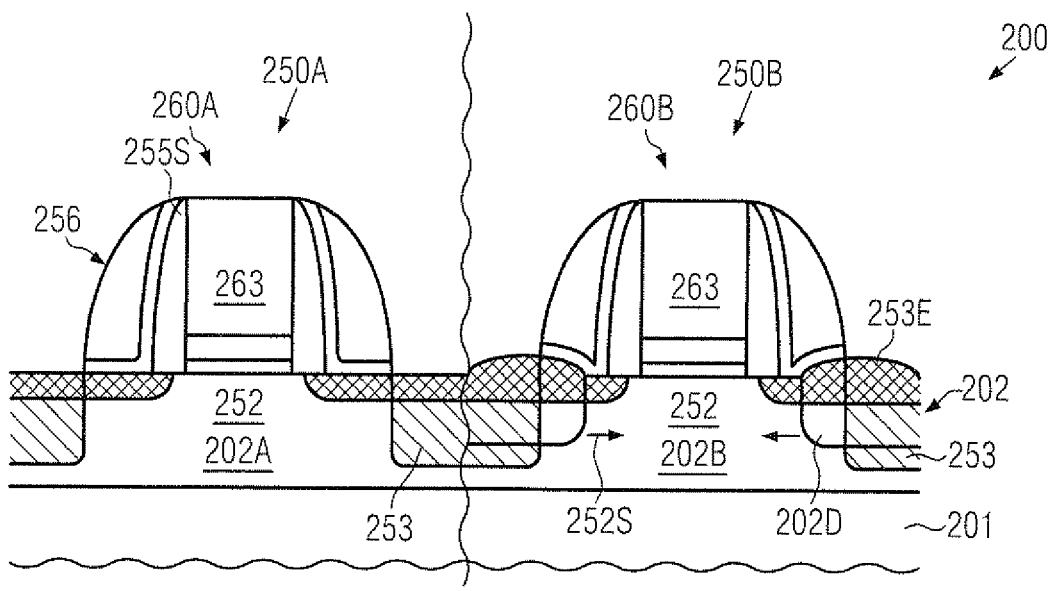

FIG. 2j schematically illustrates the semiconductor device 200 in a further advanced manufacturing stage. As illustrated, drain and source regions 253 are formed in the active regions 202A, 202B, which may be accomplished on the basis of the spacer structure 256, possibly in combination with additional intermediate implantation processes, if required, in order to obtain the desired dopant profile. Consequently, due to the incorporated strain-inducing material 202D, a strain component 252S may be induced in the channel region 252 of the transistor 250B, thereby significantly enhancing overall transistor performance as may be required in high performance integrated circuits. It should be appreciated that similar strain-inducing mechanisms may also be implemented in the transistor 250A, if required. Next, the processing may be continued by forming metal silicide regions in the gate electrode structures 260A, 260B, and in the drain and source regions 253 as is also previously described.

Consequently, the efficient removal of the dielectric cap material of the gate electrode structures 260A, 260B by avoiding silicon nitride etch chemistries may also be efficiently performed for the device 200 requiring the incorporation of the strain-inducing semiconductor material 202D.

With reference to FIGS. 3a-3g, further illustrative embodiments will be described in which an efficient spacer regime may be used for removing a dielectric cap material, such as a silicon nitride cap material, while at the same time reducing any negative effects of a silicon nitride-based etch chemistry.

Figure 3A:
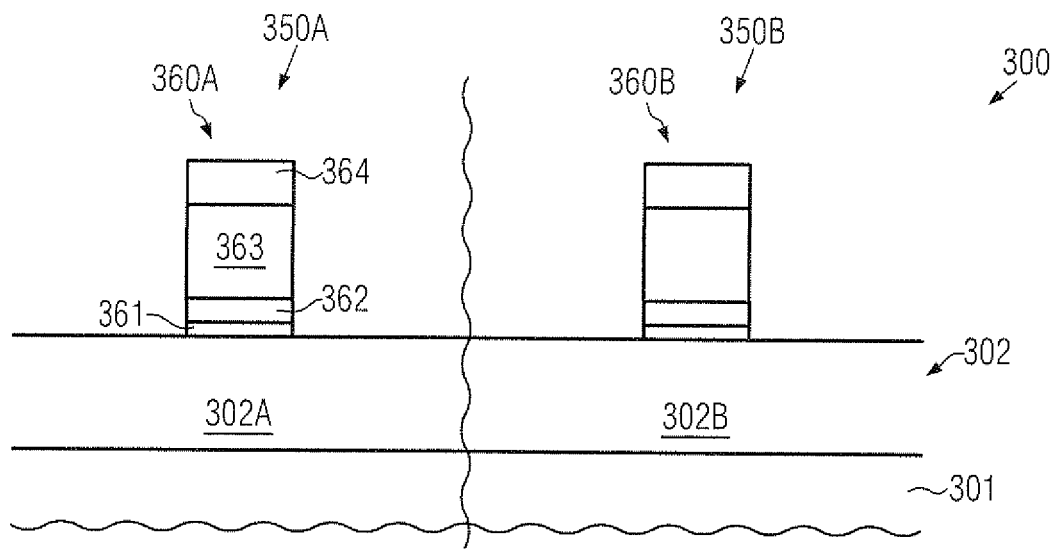
FIGS. 3a-3g schematically illustrate cross-sectional views of a semiconductor device during various manufacturing stages, in which a dielectric cap material of the gate electrode structure is removed in a very advanced manufacturing stage, i.e., after forming the drain and source regions, wherein corresponding sidewall spacers may act as an etch stop material during the removal of the dielectric material, according to still further illustrative embodiments.

FIG. 3a schematically illustrates a semiconductor device 300 including a substrate 301 and a semiconductor layer 302 having formed therein active regions 302A, 302B. Moreover, a gate electrode structure 360A may be formed on the active region 302A and a gate electrode structure 360B may be formed on the active region 302B. The gate electrode structures 360A, 360B may comprise a gate dielectric material 361, a conductive cap material 362 and an additional electrode material 363. It should be appreciated that, for the components described so far, the same criteria may apply as previously discussed with reference to the semiconductor devices 100 and 200. Thus, any detailed description of these components may be omitted here. Furthermore, the gate electrode structures 360A, 360B may comprise a silicon nitride-based dielectric cap material 364, as is, for instance, also described previously with respect to the semiconductor device 100.

The semiconductor device 300 as shown in FIG. 3a may be formed on the basis of any appropriate process strategy, as is, for instance, previously described with reference to the devices 100 and 200.

Figure 3B:
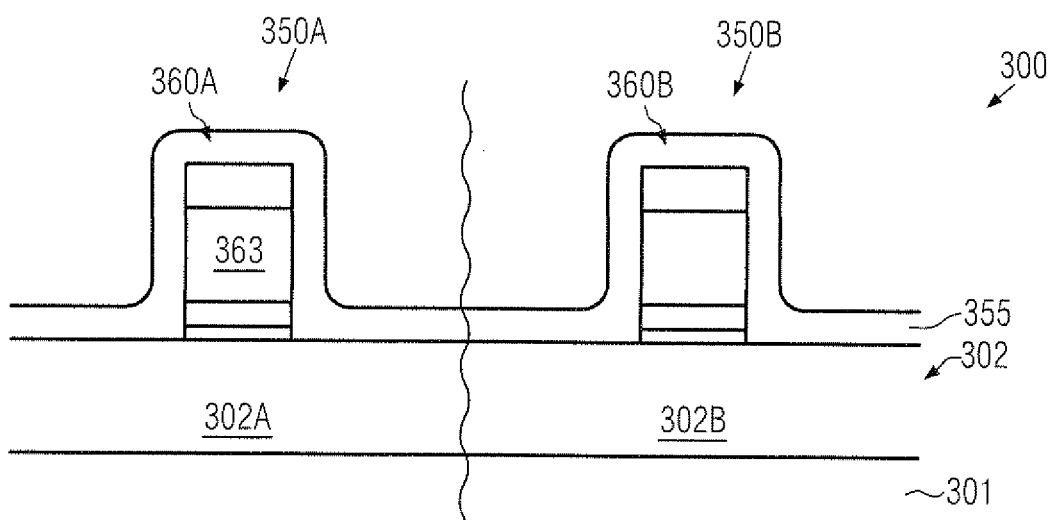

FIG. 3b schematically illustrates the device 300 with a liner material 355 formed above the active regions 302A, 302B and on the gate electrode structures 360A, 360B. The liner material 355 may be provided in the form of a silicon nitride material, as is also previously explained. Thereafter, the liner 355 may be patterned into sidewall spacers, as is also previously discussed.

Figure 3C:
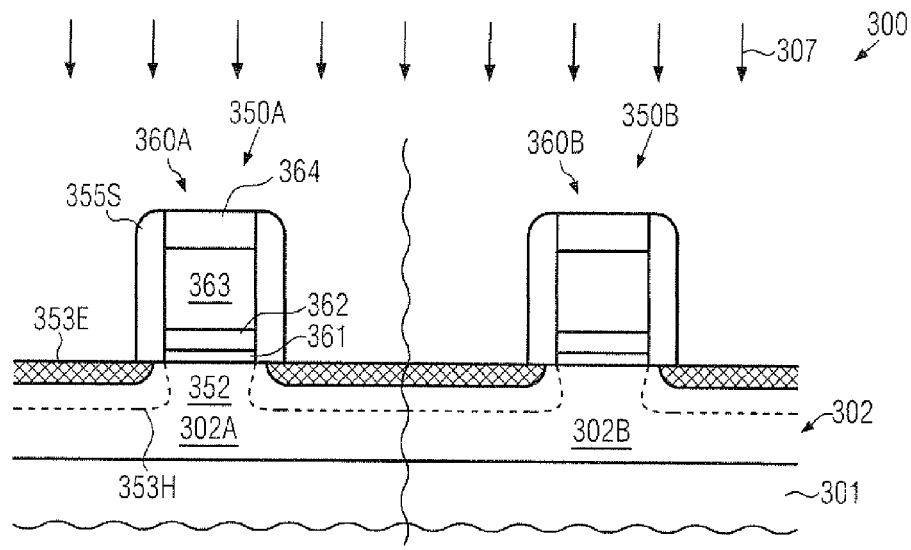

FIG. 3c schematically illustrates the semiconductor device 300 in a further advanced manufacturing stage in which an implantation sequence 307, in combination with an appropriate masking regime, may be applied to form drain and source extension regions 353E and halo regions 353H in the active regions 302A, 302B. As previously explained with reference to the implantation sequence 207 (FIG. 2c), corresponding implantation masks may be formed and removed in accordance with any appropriate process strategy, wherein the spacer structure 355S and the dielectric cap material 364 may preserve integrity of the materials 363, 362 and 361. Furthermore, due to the presence of the dielectric cap layer 364, a superior ion blocking effect of the gate electrode structures 360A, 360B may be obtained, as previously discussed, thereby allowing higher implantation energies to be used, in particular for forming the halo regions 353H.

Figure 3D:
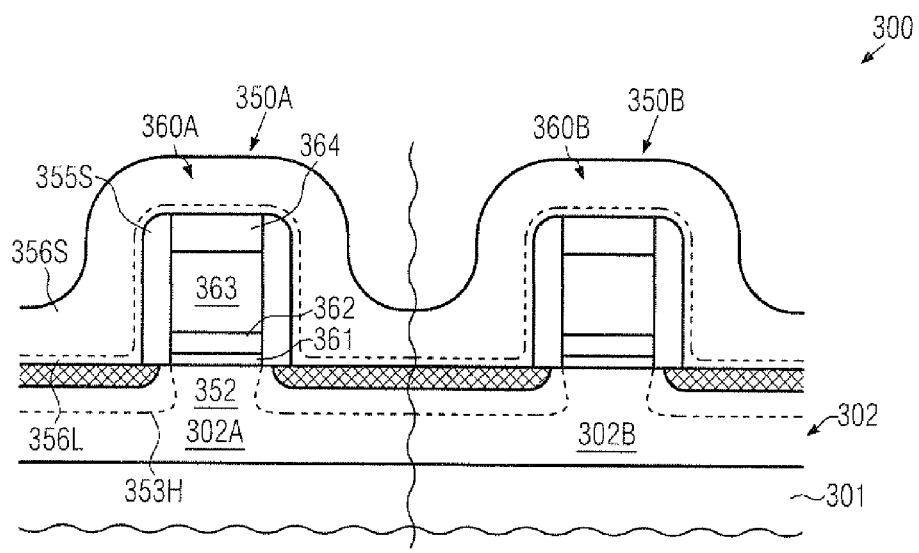

FIG. 3d schematically illustrates the device 300 with a spacer layer 356S formed above the gate electrode structures 360A, 360B and above the active regions 302A, 302B. The spacer layer 356S, or at least a significant portion thereof, may be comprised of a material that may withstand the etch chemistry that may be applied during the removal of the dielectric cap layer 364 in a later manufacturing stage. For example, the spacer layer 356S, or at least a significant portion thereof, may be comprised of silicon dioxide, which may have a high etch resistivity upon removing silicon nitride material. In some illustrative embodiments, the spacer layer 356S may comprise an etch stop liner 356L, for instance in the form of a silicon nitride material and the like. The spacer layer 356S may be formed on the basis of well-established deposition techniques.

Figure 3E:
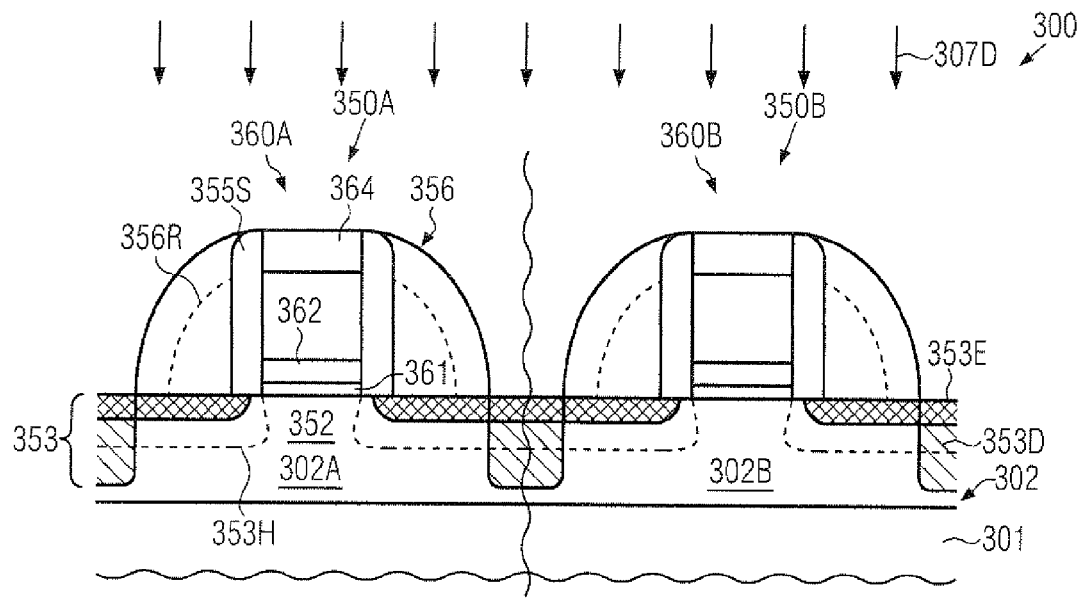

FIG. 3e schematically illustrates the semiconductor device 300 in a further advanced manufacturing stage. As illustrated, a spacer structure 356 formed from the spacer layer 356S (FIG. 3d) may be formed adjacent to the spacer structures 355S, which may be accomplished on the basis of well-established anisotropic etch recipes. The spacer structure 356 in combination with the spacer structure 355S and the gate electrode structures 360A, 360B may act as an implantation mask, in combination with other resist masks used during an implantation sequence 307D in order to form deep drain and source regions 353D in the active regions 302A, 302B. Consequently, during the implantation sequence 307D, a superior ion blocking effect caused by the dielectric cap layer 364 may be obtained, since an increased "gate height" is achieved, thereby avoiding undue incorporation of a dopant species into the channel regions 352 of the transistors 350A, 350B. If desired, the spacer structure 356 may be reduced in size prior to the implantation sequence 307D so as to create a more sophisticated lateral profile when using increased implantation energies for the deep drain and source regions 353D. For instance, as indicated by 356R, increased implantation energies may be applied for a reduced spacer structure, thereby achieving a "buffer" implantation for connecting the drain and source extension regions 353E more efficiently to the deep drain and source regions 353D that are formed on the basis of an increased penetration depth, while the cap layer 364 preserves integrity of the channel region 352. Consequently, the drain and source regions 353, i.e., the deep drain and source regions 353D in combination with the extension regions 353E, may be formed on the basis of superior process conditions, for instance in view of implantation energy.

Figure 3F:
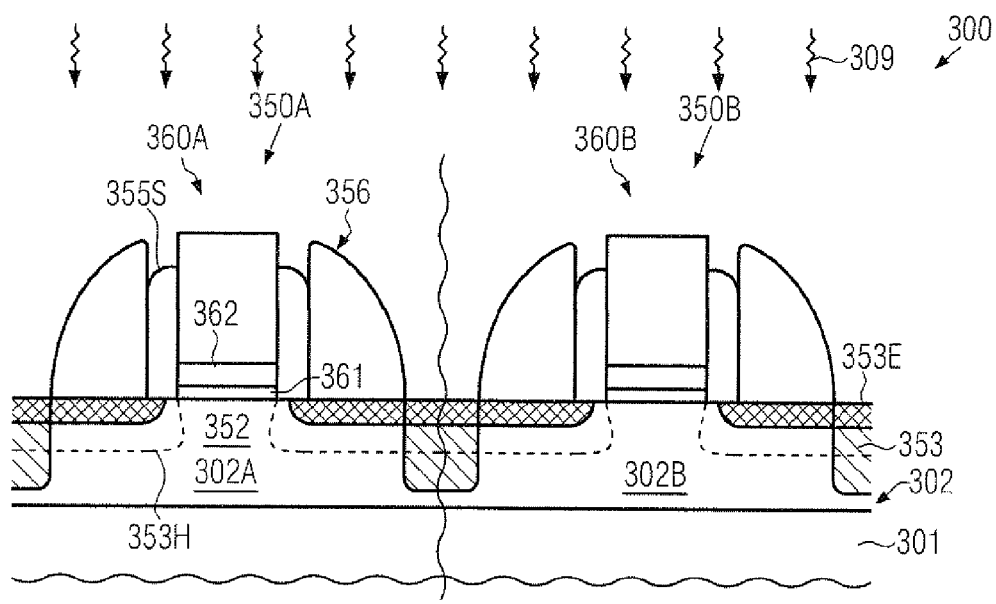

FIG. 3f schematically illustrates the semiconductor device 300 in a further advanced manufacturing stage. As illustrated, the dielectric cap layer 364 (FIG. 3e) may be removed, which may be accomplished on the basis of well-established silicon nitride etch chemistries, such as hot phosphoric acid, plasma assisted etch recipes and the like. Moreover, the spacer structure 356 may protect at least most of the spacer structure 355S, thereby ensuring a reliable confinement of the sensitive materials 361 and 362. Furthermore, prior to or after the removal of the dielectric cap layer 364 (FIG. 3e), an anneal process 309 may be performed in order to activate the dopant species of the drain and source regions 353, thereby also increasing density of the spacer structure 356, thereby imparting enhanced etch resistivity to the material, for instance in view of further cleaning processes, which may typically be performed prior to forming metal silicide regions.

Figure 3G:
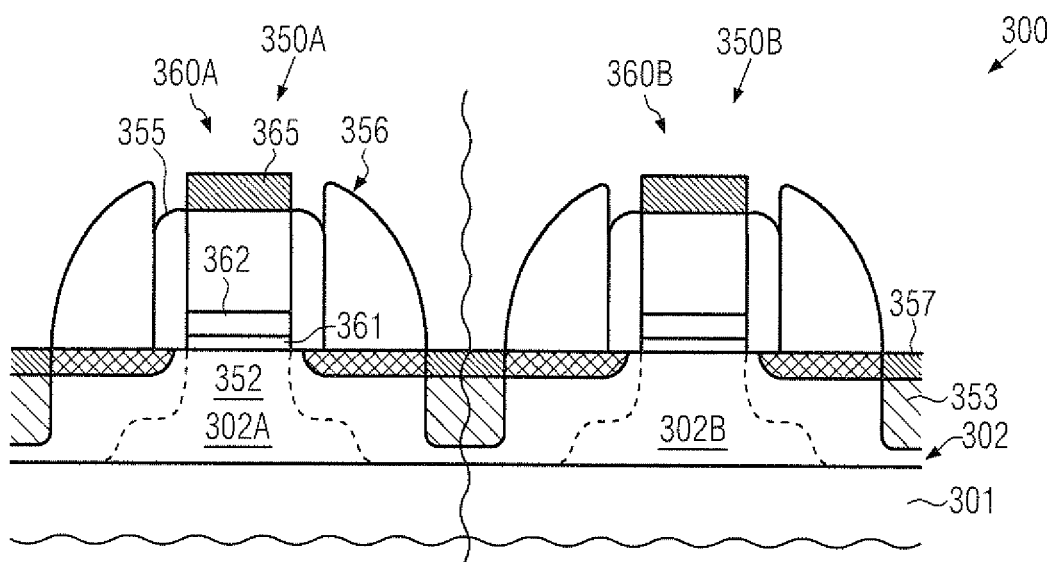

FIG. 3g schematically illustrates the semiconductor device 300 with metal silicide 365 formed in the gate electrode structures 360A, 360B and metal silicide 357 formed in the drain and source regions 353. The metal silicide material may be formed on the basis of any well-established process strategy and may include any appropriate material, such as nickel, platinum, cobalt and the like. As discussed above, during the preceding anneal process, the etch resistivity of the spacer structure 356 may be enhanced, thereby avoiding any undue material loss of the spacer structure 356 so that a lateral offset of the metal silicide regions 357 from channel regions 352 may be reliably adjusted on the basis of the spacer structure 356. In other illustrative embodiments, an etch stop liner, such as a silicon nitride liner, may be provided in the spacer structure 356, as previously indicated, wherein the removal of the dielectric cap material may be performed on the basis of a plasma assisted etch process, thereby avoiding any undue under-etching of the etch stop liner, such as the silicon nitride material, which may thus reliably determine a lateral offset of the metal silicide regions 357, irrespective of any material erosion of a silicon dioxide material of the spacer structure 356 caused by any pre-silicidation cleaning processes.

Thereafter, the further processing may be continued by depositing an interlayer dielectric material and forming contact elements therein in accordance with any appropriate process strategy.

As a result, the present disclosure provides semiconductor devices and manufacturing techniques in which the removal of a dielectric cap layer of a sophisticated high-k metal gate electrode structure may be accomplished on the basis of an improved sidewall spacer structure regime, while, in other cases, the usage of a silicon nitride etch chemistry may be avoided. Consequently, reduced complexity and/or superior device performance may be accomplished on the basis of strategies in which the work function and, thus, the threshold voltage of transistors may be set in an early manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a gate electrode structure of a transistor above a semiconductor region of a semiconductor device, said gate electrode structure comprising a gate insulation layer comprising a high-k gate dielectric material, a metal-containing cap material formed on said gate insulation layer, an electrode material formed above said cap material and a dielectric cap layer comprised of silicon dioxide formed above said electrode material;

forming a first spacer structure comprised of silicon nitride on sidewalls of said gate electrode structure;

performing a first implantation process to form drain and source extension regions by using at least a portion of said gate electrode structure and said first spacer structure as a first implantation mask;

after performing said first implantation process, reducing a size of said first spacer structure;

after reducing said size of said first spacer structure removing said dielectric cap layer by using said reduced-size first spacer structure as an etch stop material;

after removing said dielectric cap layer, forming a second spacer structure on said reduced-size first spacer structure; and performing a second implantation process to form drain and source regions by using said second spacer structure as a second implantation mask.

* * * * *